(12) United States Patent  
Nuechter et al.

(10) Patent No.: US 7,696,001 B2  
(45) Date of Patent: Apr. 13, 2010

(54) METHOD FOR MOUNTING SEMICONDUCTOR CHIPS ON A SUBSTRATE AND CORRESPONDING ASSEMBLY

(75) Inventors: Wolfgang Nuechter, Tamm (DE); Thomas Ruzicka, Bietigheim-Bissingen (DE); Manfred Spraul, Homburg (DE)

(73) Assignee: Robert Bosch GmbH, Stuttgart (DE)

( * ) Notice: Subject to any disclaimer, the term of this patent is extended or adjusted under 35 U.S.C. 154(b) by 207 days.

(21) Appl. No.: 11/376,446

(22) Filed: Mar. 14, 2006

(65) Prior Publication Data

US 2006/0220258 A1  Oct. 5, 2006

(30) Foreign Application Priority Data

Apr. 1, 2005 (DE) .................. 10 2005 015 109

(51) Int. Cl.  
*H01L 21/00* (2006.01)

(52) U.S. Cl. ............... 438/106; 438/26; 438/27; 438/108; 257/778; 257/724

(58) Field of Classification Search ............ 438/26, 438/27, 108, 106; 257/778, 724, E23.001, 257/E23.003, E23.069  
See application file for complete search history.

(56) References Cited

U.S. PATENT DOCUMENTS

| | | | | |
|---|---|---|---|---|
| 6,053,394 A * | 4/2000 | Dockerty et al. | ....... | 228/180.22 |
| 6,140,144 A * | 10/2000 | Najafi et al. | .......... | 438/53 |
| 6,214,644 B1 * | 4/2001 | Glenn | .......... | 438/108 |
| 6,566,170 B1 * | 5/2003 | Marion et al. | .......... | 438/126 |
| 6,800,946 B2 * | 10/2004 | Chason et al. | .......... | 257/778 |
| 6,808,955 B2 * | 10/2004 | Ma | .......... | 438/51 |
| 2003/0207493 A1 * | 11/2003 | Trezza et al. | .......... | 438/107 |
| 2004/0067605 A1 * | 4/2004 | Koizumi | .......... | 438/108 |
| 2004/0182913 A1 * | 9/2004 | Deane et al. | .......... | 228/180.22 |
| 2004/0261904 A1 * | 12/2004 | Chen et al. | .......... | 148/23 |
| 2005/0194685 A1 * | 9/2005 | Weiblen et al. | .......... | 257/738 |

FOREIGN PATENT DOCUMENTS

DE  10 2004 011 203.7  9/2005

* cited by examiner

*Primary Examiner*—Lynne A Gurley  
*Assistant Examiner*—Meiya Li  
(74) *Attorney, Agent, or Firm*—Kenyon & Kenyon LLP

(57) ABSTRACT

A method for mounting semiconductor chips on a substrate using flip-chip technology and a corresponding assembly are provided, which method includes the steps of: a) providing a semiconductor chip having a component region including components and an edge region, a mounting region containing a plurality of bonding pads being situated in the edge region; b) providing a substrate having a surface including a plurality of lands; c) applying soldering material to the bonding pads and/or to the lands; d) positioning the semiconductor chip on the substrate; and e) melting the soldering material by a soldering process in such a way that the mounting region of the semiconductor chip is moved towards the substrate due to the surface tension of the melting soldering material, and the component region is lifted away from the substrate by the resulting rotation around an axis of rotation or a pivot between the two regions.

10 Claims, 5 Drawing Sheets

METHOD FOR MOUNTING SEMICONDUCTOR CHIPS ON A SUBSTRATE AND CORRESPONDING ASSEMBLY

FIELD OF THE INVENTION

The present invention relates to a method for mounting semiconductor chips on a substrate using flip-chip technology and a corresponding assembly.

BACKGROUND INFORMATION

Packaging technology for electronic circuits is becoming a more and more complex field. The reason for this is on the one hand the rising technical requirements placed on miniaturization in microtechnologies and on the other hand the enormous pressure to provide for a technology that is as cost-effective as possible and yet reliable. One possibility in this regard is offered by flip-chip technology. In flip-chip technology, unhoused semiconductor chips are mounted directly on a substrate by a simultaneous contacting process. This ensures the shortest wiring paths. Typically, the semiconductor chip is positioned over a substrate with its active side, i.e., the side bearing the components, facing down and is contacted by a soldering process or a bonding process. For this purpose, one of the bonding partners —the semiconductor chip or the substrate —has contacting protuberances, which in the case of a soldering process are also called "solder bumps" or simply "bumps." The bumps melt during the soldering process and thus connect the semiconductor chip electrically and mechanically with the substrate.

The bumps are usually attached peripherally or on two opposite edge regions of the semiconductor chip. Following the soldering process, the semiconductor chip is thereby connected to the substrate at least on both sides—more precisely on opposite edge regions. This procedure, however, is unfavorable particularly in a semiconductor chip having micromechanical sensor elements. In temperature changes, different thermal expansions cause the semiconductor chip and the substrate to shift relative to each other, producing mechanical stresses. These stresses affect the measured values of the sensor elements, which are often beyond what can be tolerated.

A possibility for preventing or reducing such stresses is to arrange all bumps and thus all electrical and mechanical contacts only in one edge region. Such an arrangement is described, for example, in German patent document DE 102004011203.7.

The production of unilaterally attached semiconductor chips is not without problems, however. For a reliable anchorage before and during the soldering process, a holding device is required which holds the semiconductor chip for the soldering process. This holding device can either be removed following the soldering process or can remain on the semiconductor chip. In the first case, an additional process with associated costs is in turn necessary; in the second case, again forces affecting the sensor elements act on the semiconductor chip in the operating state.

Thus there is a need for a method for mounting unilaterally attached semiconductor chips, which method dispenses with a removal of the holding device required for anchoring the semiconductor chips.

SUMMARY OF THE INVENTION

The method according to the present invention for mounting semiconductor chips on a substrate using flip-chip technology and the corresponding assembly make it possible to manufacture semiconductor chips unilaterally attached on the substrate without having to use a holding device which would have to be removed following the soldering process. Harmful applications of force on sensor elements of the semiconductor chip are thereby prevented entirely. The method according to the present invention provides for the soldering process to trigger a dynamic process of the semiconductor chip by utilizing a lever action, which ensures a stable and reliable final state of the two bonding partners. In particular, temperature fluctuations also do not result in mechanical stresses in the bonding partners.

DETAILED DESCRIPTION

Figure 1:
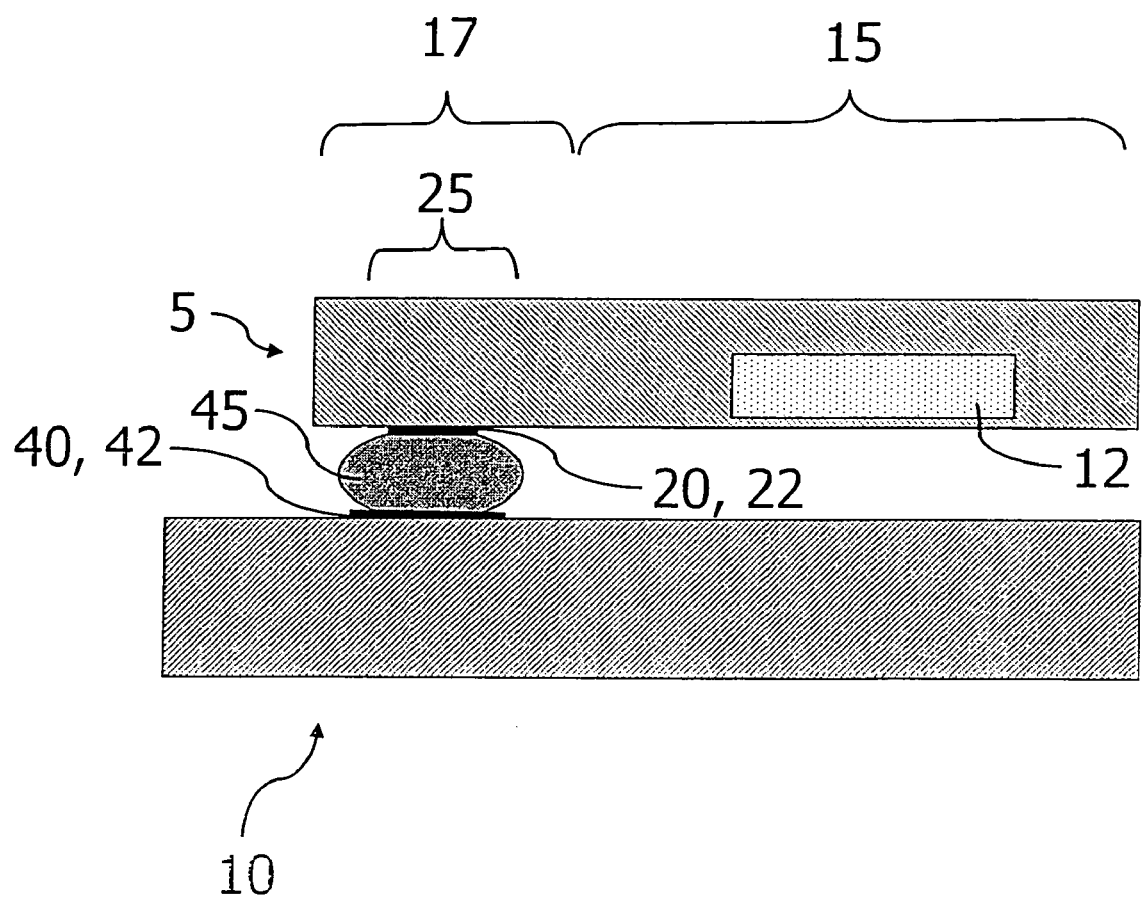
FIG. 1 shows a cross-sectional view of a semiconductor chip mounted on a substrate using flip-chip technology.

As shown in FIG. 1, a semiconductor chip 5 is mounted on a substrate 10 using flip-chip technology. In the process, they are connected electrically and mechanically by soldering material 45. Semiconductor chip 5 has a component region 15 comprising components 12. Components 12 are often sensor elements and may be micromechanical structures such as diaphragms, microbars ("cantilevers") or even microbridges, for example. Silicon is a suitable material for semiconductor chip 5. Often piezoresistive materials were used specifically in the micromechanical structures in order to obtain a change in resistance as a sensor signal. In addition to sensor elements, components 12 may also be HF components (high-frequency components). In the other FIGS. 2 through 4, incidentally, a representation of components 12 in component region 15 was omitted for reasons of clarity.

In an edge region 17 shown in FIG. 1, semiconductor chip 5 has a mounting region 25. Mounting region 25 in turn has a plurality of so-called bonding pads 20, 22 which act as a solderable surface on semiconductor chip 5. FIG. 1 is a sectional view, which is why only one bonding pad 20, 22 is visible. Likewise there are solderable surfaces on substrate 10 which are called lands 40, 42. Substrate 10 itself may be an organic circuit board ("printed circuit board"—PCB) or a ceramic circuit substrate. Extrusion-coated pressed screens or injection-molded circuit substrates (molded interconnect devices—MID) are also possible as substrates 10.

The method for mounting semiconductor chips 5 on a substrate 10 may include the following steps. As described above, first in step a), a semiconductor chip 5 having a component region 15 comprising components 12 and an edge region 17 is provided, a mounting region 25 comprising a plurality of bonding pads 20, 22 being situated in edge region 17. Furthermore, in the next step b), a substrate 10 having a surface comprising a plurality of lands 40, 42 is provided. Afterwards, in a step c), soldering material 45 is applied to bonding pads 20, 22 and/or to lands 40, 42. Semiconductor chip 5 may now be separated if necessary. In step d), semiconductor chip 5 is subsequently positioned on substrate 10. Finally, in a step e), soldering material 45 is molten by a soldering process in such a way that mounting region 25 of semiconductor chip 5 is moved towards substrate 10 due to the surface tension of melting soldering material 45 and component region 15 is lifted away from substrate 10 by the resulting rotation around an axis of rotation or pivot between the two regions 15, 25.

Thus the soldering process in step e) triggers a dynamic rotary motion of semiconductor chip 5, the axis of rotation or pivot being located between mounting region 25 and component region 15. In the process, component region 15 lifts off from the surface of substrate 10 and no longer contacts substrate 10 directly, but only indirectly via soldering material 45 at mounting region 25.

Figure 2:
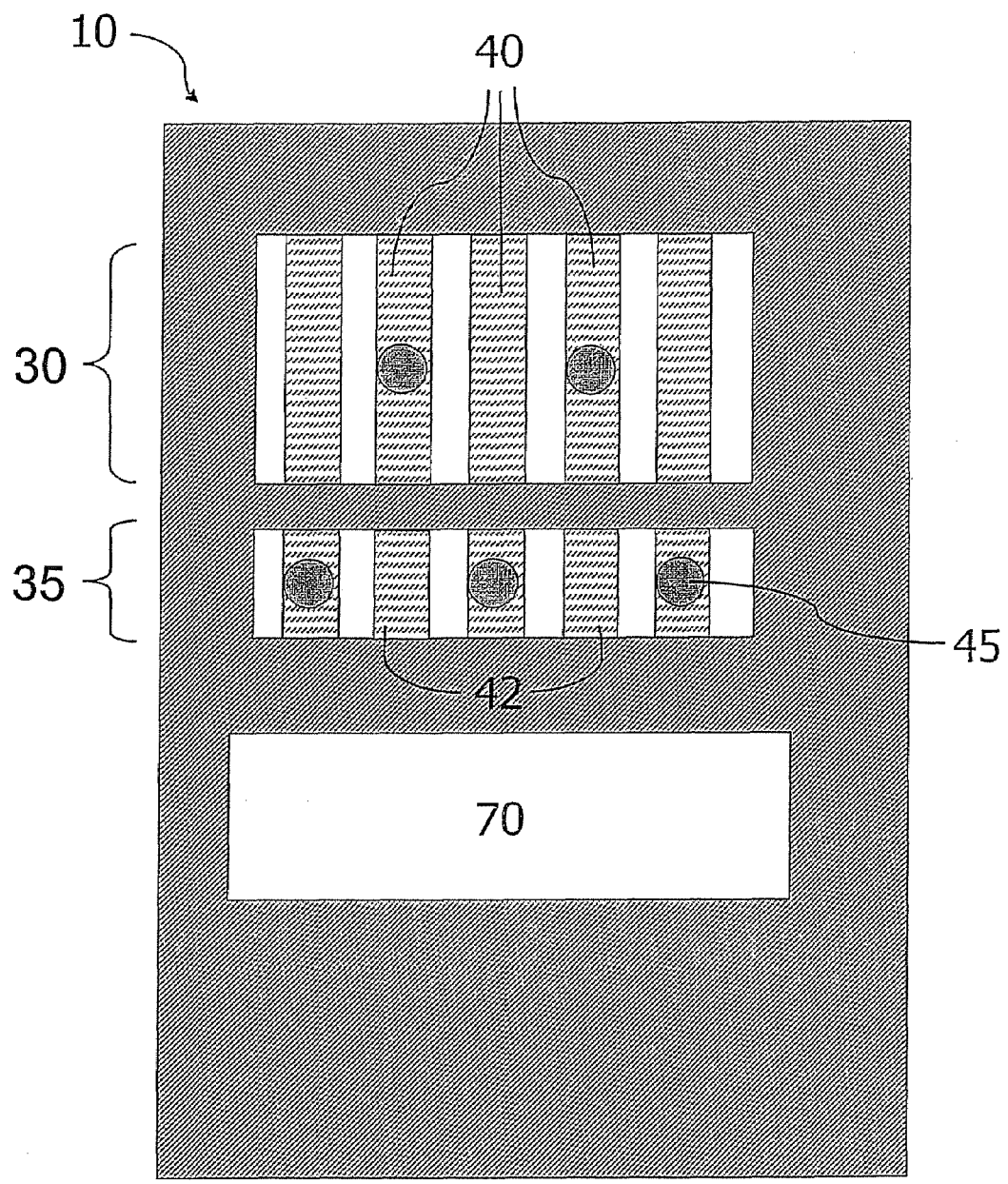
FIG. 2 shows a top view of rows of lands on a substrate.

Several options exist for producing such an angular momentum in the soldering process. An example variant is the use of lands 40, 42 having surface areas of different size. As shown in FIG. 2, in this variant a first land row 30 and a second land row 35 can be seen on the surface of substrate 10 in a top view. The number and arrangement of bonding pads 20, 22 in mounting region 25 of semiconductor chip 5 are adapted accordingly, i.e., there is a first and a second row of bonding pads 20, 22. In this example, the lands 40 of first land row 30 furthermore have a larger surface area than the lands 42 of second land row 35. The lands 42 of the second land row 35 have a customary surface area approximately as large as bonding pads 22 for second bump row 55, while lands 40 in first land row 30 have a substantially larger surface area than bonding pads 20 for first bump row 50.

Figure 3A:
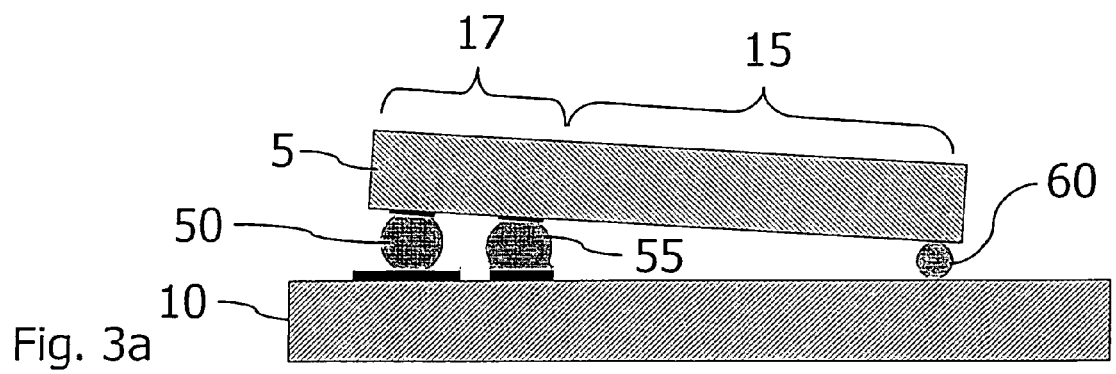
FIGS. 3a to 3c illustrate the steps of an exemplary implementation of the method according to the present invention for mounting semiconductor chips on a substrate.

As seen in FIG. 3a, a first bump row 50 and a second bump row 55 are then formed by applying soldering material 45 to bonding pads 20, 22 in accordance with step c) described above. Alternatively, however, soldering material 45 may instead or additionally be applied to lands 40, 42, if necessary. Furthermore, it is also possible to optionally apply one or more support bases 60 on component region 15 of semiconductor chip 5 or on the opposite surface of substrate 10. Support base 60 is to prevent semiconductor chip 5 from tilting during flip-chip mounting. It should be noted that optional support base 60 is not mounted on a soldering surface such that semiconductor chip 6 in this component region 15 merely rests on the surface of substrate 10 without being attached to it. In the final state following the entire flip-chip mounting process, support base 60 is only attached to one bonding partner and therefore cannot produce any mechanical stresses.

Subsequently, in accordance with step d) described above, semiconductor chip 5 is positioned on substrate 10. Second bump row 55 is situated between first bump row 50 and component region 15.

Figure 3B:
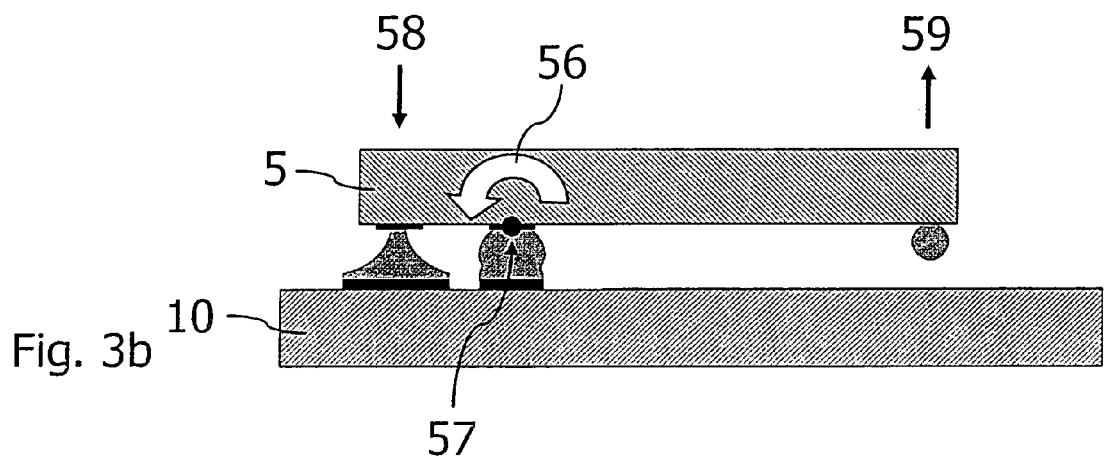

FIG. 3b illustrates subsequent step e), in which soldering material 45 is molten in a soldering process. The soldering process occurs by a hot plate, condensation or other techniques of reflow soldering. In the soldering process, molten soldering material 45 flows in the first bump row onto large-area lands 40 in first land row 30, while soldering material 45 of the second bump row at the same soldering volume is able to flow onto small-area lands 42 in second land row 35. The surface tension of the flowing soldering material 45 on large-area lands 40 produces in this region on semiconductor chip 5 a force 58 directed towards substrate 10, and it pulls mounting region 25 of semiconductor chip 5 down to substrate 10. Since at the same time, however, soldering material 45 is hardly able to flow in the small-area lands 42 in second land row 35, the points of second bump row 55 act as an axis of rotation or pivot 57 of the resulting rotation 56. Rotation 56 in the process applies a force 59 directed away from substrate 10 on component region 15, as a result of which component region 15 is lifted away from substrate 10.

Figure 3C:
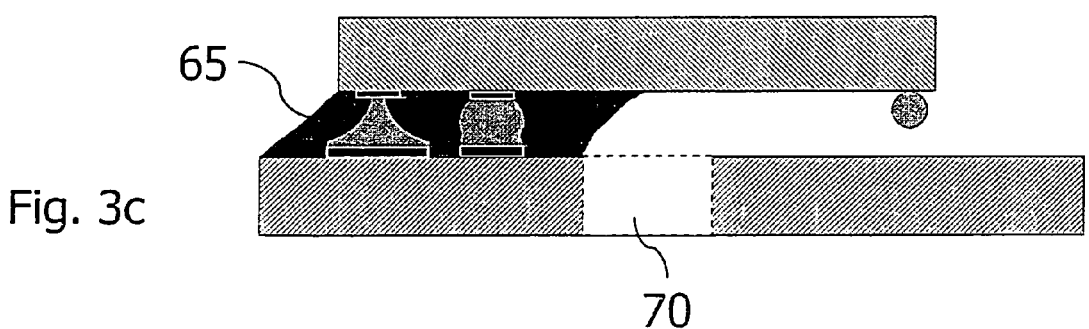

As shown in FIG. 3c, corresponding to the above-described step e), semiconductor chip 5 may optionally be underfilled by an underfilling 65 between mounting-region 25 of semiconductor chip 5 and the region of substrate 10 comprising lands 40, 42 so as to increase the mechanical load-bearing capacity of semiconductor chip 5 if required. Underfilling 65 is normally an insulating plastic material. To-prevent underfilling 65 from flowing under the entire semiconductor chip 5, substrate 10 has a recess 70. The edge of recess 70 ensures that underfilling 65 is not able to get into or underneath component region 15.

Figure 4:
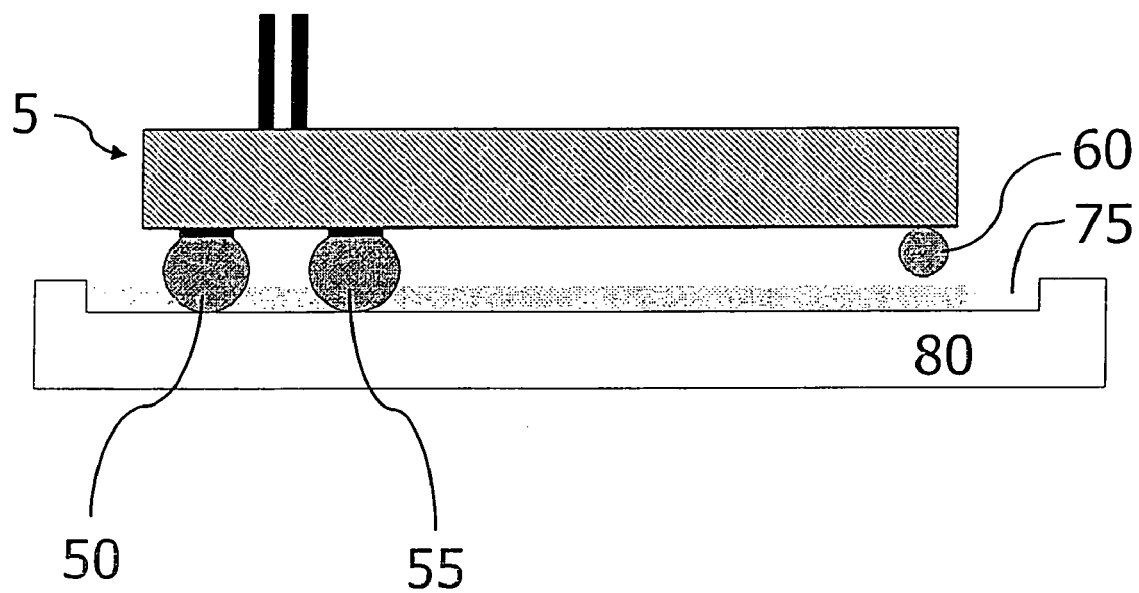
FIG. 4 shows a dipping process for applying fluxing agent on the soldering material.

If necessary, the method according to the present invention may be additionally optimized by the following measures without changing the principle of the invention. For example, following step c), fluxing agent may be applied to soldering material 45 in order to carry out the later soldering process more reliably. The fluxing agent is a soldering aid that is to keep soldering material 45 or the surfaces to be covered by the soldering material fee of oxides. As shown in FIG. 4, fluxing agent 75 may be applied for example by dipping, that is by briefly immersing soldering material 45 in a liquid fluxing agent 75. Semiconductor chip 5 having the soldering bumps is immersed in a container 80 of liquid fluxing agent 75. For this purpose, it is advantageous if all soldering bumps in bump rows 50, 55 have the same height. Depending on the type of semiconductor chip 5, it is possibly also advantageous if additional support bases 60 ensure that components 12 do not come into contact with fluxing agent 70. These support bases 60 are typically smaller than the soldering bumps in bump rows 50, 55 since it is not necessary to ensure that they themselves are immersed into fluxing agent 75. The support bases 60 mentioned earlier may thus aid the method in various functions.

Figure 5:
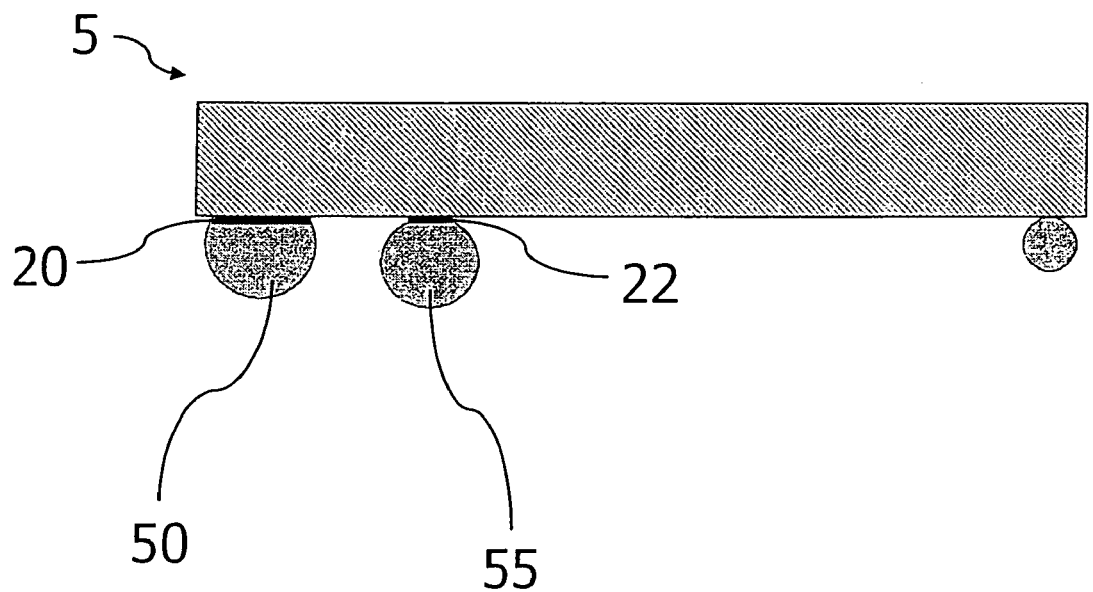
FIG. 5 illustrates an example embodiment in which the surface areas of the bonding pads vary.

Another exemplary embodiment provides for varying the surface areas of bonding pads 20, 22 instead of the surface areas of lands 40, 42. For producing the angular momentum in the soldering process, in step a), a semiconductor chip 5 is provided in the which bonding pads 20 for the first bump row 50 have a larger surface area than bonding pads 22 for the second bump row 55 (see FIG. 5). In that case, lands 40, 42 in the first and second land rows 30, 35 no longer have to be of different size.

Figure 6:
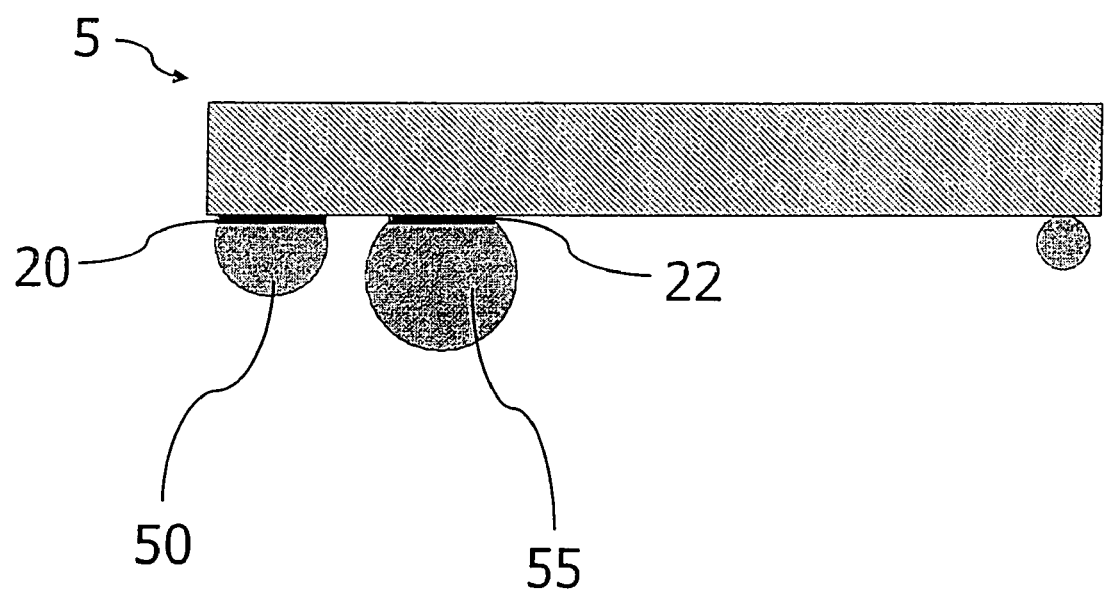
FIG. 6 illustrates an example embodiment in which different bump rows have a different quantities of soldering material.

Another exemplary embodiment provides for different quantities of soldering material 45 to be applied to bonding pads 20, 22 and/or to lands 40, 42 for forming the first bump row 50 and the second bump row 55 in step c). As can be seen in FIG. 6, first bump row 50 has solder bumps that have a smaller quantity of soldering material 45 than the solder bumps in the second bump row 55. As a result, a variation of the size of the bonding pads 20, 22 or of the lands 40, 42 is no longer necessary in order to produce an angular momentum in the soldering process. The last two exemplary embodiments, however, result in differently sized solder bumps and may not be especially suited for applying fluxing agent 75 by dipping.

In addition to the above, a combination of the features from the exemplary embodiments is in principle possible as well. Thus, for example, in addition to the differently sized lands 40, 42, different quantities of soldering material 45 may be applied to bonding pads 20, 22 or to lands 40, 42.

Incidentally, it is possible even in a double-sided reflow process to lift semiconductor chip 5 in component region 15 using the method presented: Following the execution of the first reflow process on one side of semiconductor chip 5, in the second reflow process the two bonding partners are turned around and the gravitational force in the process naturally helps to turn semiconductor chip 5 in component region 15 away from substrate 10.

What is claimed is:

1. A method for mounting a semiconductor chip on a substrate using flip-chip technology, the method comprising:
   a) providing a semiconductor chip having a component region and an edge region, wherein the component region includes a component, and wherein a mounting region including a set of bonding pads is situated in the edge region;
   b) providing a substrate having a surface including a set of lands, the set of lands on the substrate forming a first land row and a second land row, the first land row and the second land row being aligned parallel to each other;
   c) applying a soldering material to at least one of: i) the set of bonding pads; and ii) the set of lands, whereby a first bump row and a second bump row are formed;
   d) positioning the semiconductor chip on the substrate; and
   e) differential melting of the soldering material of the first bump row and the second bump row by a soldering process, whereby the mounting region of the semiconductor chip is moved towards the substrate due to surface tension of the melting soldering material of the first bump row and the component region is lifted away from the substrate by a resulting rotation around the second bump row, the second bump row acting as an axis of rotation between the mounting region and the component region.

2. The method as recited in claim 1, wherein the set of bonding pads provided in step a) are configured in such a way that the bonding pads for the first bump row each has a larger surface area than the bonding pads for the second bump row.

3. The method as recited in claim 1, wherein the set of lands provided in step b) are configured in such a way that the lands of the first land row each has a larger surface area than the lands of the second land row.

4. The method as recited in claim 1, wherein the set of lands provided in step b) is configured in such a way that the lands of the first land row each has a larger surface area than the bonding pads for the first bump row.

5. The method as recited in claim 1, wherein in step c), a quantity of the soldering material used to form the first bump row is different from a quantity of the soldering material used to form the second bump row.

6. The method as recited in claim 1, further comprising:
   mounting, in step c), at least one support base on one of: a) the component region of the semiconductor chip; and b) the surface of the substrate.

7. The method as recited in claim 6, further comprising:
   between steps c) and d), applying a fluxing agent to the soldering material.

8. The method as recited in one of claim 1, further comprising:
   providing, following step e), an underfilling below the semiconductor chip between the mounting region of the semiconductor chip and a region of the substrate on which the lands are situated.

9. The method as recited in claim 1, wherein in step e), the soldering process is performed using a technique including one of: i) hot plate; ii) condensation; and iii) reflow soldering.

10. The method as recited in claim 1, wherein the component is a micromechanical sensor element.

\* \* \* \* \*